United States Patent
Matsumoto et al.

(10) Patent No.: US 9,263,298 B2
(45) Date of Patent: Feb. 16, 2016

(54) PLASMA ETCHING APPARATUS AND PLASMA ETCHING METHOD

(75) Inventors: Naoki Matsumoto, Hyogo (JP); Kazuto Takai, Hyogo (JP); Reika Ko, Chiba (JP); Nobuyuki Okayama, Hyogo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 916 days.

(21) Appl. No.: 12/919,293

(22) PCT Filed: Feb. 26, 2009

(86) PCT No.: PCT/JP2009/053556
§ 371 (c)(1),
(2), (4) Date: Oct. 20, 2010

(87) PCT Pub. No.: WO2009/107718
PCT Pub. Date: Sep. 3, 2009

(65) Prior Publication Data
US 2012/0012556 A1    Jan. 19, 2012

(30) Foreign Application Priority Data

Feb. 27, 2008 (JP) ................................. 2008-045696
Nov. 18, 2008 (JP) ................................. 2008-294049

(51) Int. Cl.
*C23C 16/00* (2006.01)
*C23F 1/00* (2006.01)
(Continued)

(52) U.S. Cl.
CPC ..... *H01L 21/32137* (2013.01); *H01J 37/32192* (2013.01); *H01J 37/32935* (2013.01); *H01L 21/67109* (2013.01); *H01L 21/67248* (2013.01); *H01J 2237/2001* (2013.01)

(58) Field of Classification Search
USPC ............. 156/345.27, 345.33–345.36, 345.41, 156/345.52, 345.53; 118/723 MW, 723 ME, 118/723 MR, 715
See application file for complete search history.

(56) References Cited

U.S. PATENT DOCUMENTS 5,415,728 A    5/1995   Hasegawa et al.
5,958,140 A *  9/1999   Arami et al. ................... 118/725
(Continued)

FOREIGN PATENT DOCUMENTS

JP      05-190506 A    7/1993
JP      08-191059 A    7/1996
(Continued)

OTHER PUBLICATIONS

English Machine Translation JP200788411, Sugano et al dated Apr. 5, 2007.*
(Continued)

*Primary Examiner* — Rakesh Dhingra
(74) *Attorney, Agent, or Firm* — Pearner & Gordon LLP

(57) ABSTRACT

A plasma etching apparatus 11 includes a mounting table that holds a semiconductor substrate W thereon; a first heater 18a that heats a central region of the semiconductor substrate W held on the mounting table 14; a second heater 18b that heats an edge region around the central region of the semiconductor substrate W held on the mounting table 14; a reactant gas supply unit 13 that supplies a reactant gas for a plasma process toward the central region of the semiconductor substrate W held on the mounting table 14; and a control unit 20 that performs a plasma etching process on the semiconductor substrate W while controlling the first heater 18a and the second heater 18b to heat the central region and the edge region of the processing target substrate W held on the mounting table 14 to different temperatures.

7 Claims, 7 Drawing Sheets

(51) Int. Cl.
*H01L 21/306* (2006.01)
*H01L 21/3213* (2006.01)
*H01J 37/32* (2006.01)
*H01L 21/67* (2006.01)

(56) References Cited

U.S. PATENT DOCUMENTS

| | | | |
|---|---|---|---|
| 6,250,914 B1 * | 6/2001 | Katsumata et al. | 432/5 |
| 2006/0291132 A1 * | 12/2006 | Kanno et al. | 361/234 |
| 2007/0044916 A1 * | 3/2007 | Isozaki et al. | 156/345.52 |
| 2007/0113788 A1 | 5/2007 | Nozawa et al. | |
| 2007/0209759 A1 * | 9/2007 | Miya et al. | 156/345.33 |
| 2007/0258186 A1 * | 11/2007 | Matyushkin et al. | 361/234 |
| 2008/0110569 A1 * | 5/2008 | Miya et al. | 156/345.35 |
| 2009/0242130 A1 * | 10/2009 | Tian et al. | 156/345.41 |
| 2010/0162956 A1 * | 7/2010 | Murakami et al. | 118/725 |

FOREIGN PATENT DOCUMENTS

| | | |
|---|---|---|
| JP | 09-289200 A | 11/1997 |
| JP | 11-121385 A | 4/1999 |
| JP | 2000-208491 A | 7/2000 |
| JP | 2005-100931 A | 4/2005 |
| JP | 2007-88411 A | 4/2007 |
| KR | 10-2001-0041608 A | 5/2001 |
| KR | 10-2001-0041872 A | 5/2001 |
| KR | 10-2005-0054952 A | 6/2005 |
| KR | 10-2008-0066771 A | 7/2008 |
| TW | I273655 B | 2/2007 |
| TW | 200710989 | 3/2007 |
| TW | 200807606 | 2/2008 |
| TW | 200809973 | 2/2008 |
| WO | WO 2007018157 * | 2/2007 ............. C23C 16/46 |
| WO | 2007/041668 A1 | 4/2007 |
| WO | WO 2007/063708 * | 6/2007 ............. C23C 16/00 |

OTHER PUBLICATIONS

International Search Report for PCT/JP2009/053556 dated Apr. 7, 2009.

Korean Office action for 10-2010-7019000 dated Aug. 25, 2011.

* cited by examiner

PLASMA ETCHING APPARATUS AND PLASMA ETCHING METHOD

TECHNICAL FIELD

The present invention relates to a plasma etching apparatus and a plasma etching method; and, more particularly, to a plasma etching apparatus and a plasma etching method for generating plasma by using a microwave as a plasma source.

BACKGROUND ART

A semiconductor device such as a LSI (Large Scale Integrated circuit) is manufactured by performing a multiple number of processes such as etching, CVD (Chemical Vapor Deposition) and sputtering on a semiconductor substrate (wafer) as a processing target object. As for the processes such as the etching, the CVD and the sputtering, there are plasma etching, plasma CVD, plasma sputtering, and the like using plasma as an energy supply source.

A plasma processing apparatus using a microwave as a plasma generation source is disclosed in Japanese Patent Laid-open Publication No. 2005-100931. In the plasma processing apparatus disclosed in Japanese Patent Laid-open Publication No. 2005-100931, a tapered protrusion or recess is provided on a bottom surface of a ceiling plate (dielectric plate). The tapered protrusion or recess is provided on the bottom surface of the ceiling plate to form a resonance region having an optimum electric field by using a microwave generated by a microwave generator, and, thus, stable plasma is generated in a chamber (processing vessel) and the aforementioned etching process or the like is carried out by the plasma.

Further, a method for uniformly maintaining a temperature of a semiconductor substrate as a processing target object is disclosed in Japanese Patent Laid-open Publication No. H11-121385. In Japanese Patent Laid-open Publication No. H11-121385, a heater block for heating a susceptor includes three or more resistor blocks. By controlling a temperature of each resistor block, a temperature of the susceptor is uniformly regulated in a short period of time, and, thus, the temperature of the semiconductor substrate can also be maintained uniform.

Here, when an etching process is performed on a processing target substrate, a center gas introduction method for supplying a reactant gas toward a central portion of the processing target substrate may be employed. In the center gas introduction method, the reactant gas for use in the etching is first supplied toward the central portion of the processing target substrate. Then, the reactant gas flows in a central region and in an edge region around the central region at a preset flow rate ratio. That is, the reactant gas to be used in the etching of an edge portion of the processing target substrate is flown from the central portion of the processing target substrate to the edge portion thereof, and, thus, the etching process of the edge portion of the processing target substrate is performed. In this way, the etching process is performed on the entire processing target substrate.

In such a center gas introduction method, when a typical etching process is performed, a CD (Critical Dimension) bias at the central portion of the processing target substrate and a CD bias at the edge portion thereof become different from each other.

Here, a CD bias will be briefly explained. FIG. 11 is a cross sectional view showing a part of a processing target substrate 101 before an etching process is performed. As illustrated in FIG. 11, the processing target substrate 101 has a thin layer 102; a thin layer 103 formed on the thin layer 102 to cover the thin layer 102; and a thin layer 104 having a width x and formed on the thin layer 103 by patterning. When the thin layer 103 is removed by performing an etching process on the processing target substrate 101, a width of each of the thin layer 104 and the thin layer 103 under the thin layer 104 is decreased to a width y by the etching, as shown in FIG. 12. A difference (y-x) in the widths before and after the etching is defined as a CD bias.

In the plasma etching using the center gas introduction method, although only the reactant gas is actively supplied to the central portion of the processing target substrate 101, a gas of a reaction product generated by the etching on the central portion of the processing target substrate 101 is also flown to the edge portion of the processing target substrate 101 in addition to the reactant gas flown from the central portion. For example, when a polysilicon layer is etched using a gaseous mixture of $HBr/Ar/O_2$ as the reactant gas, a highly adhesive and hardly volatile reaction product such as SiBrO may be generated. Accordingly, as shown in FIG. 13, a reaction product 105 is adhered to and deposited on a sidewall portion of the thin layer 103 to be etched, resulting in enlargement of the width of the thin layer 103. As a consequence, a CD bias at the central portion of the processing target substrate 101 and a CD bias at the edge portion thereof become different from each other.

FIG. 14 is a graph showing an example CD bias at each position on a processing target substrate etched by a plasma etching apparatus using the conventional central gas introduction method. A horizontal axis represents a distance from a center 0 of the processing target substrate, and a vertical axis represents a CD bias value. As shown in FIG. 14, a CD bias at a central portion of the processing target substrate, i.e., a CD bias in a region around 0 mm is about −12 nm, whereas a CD bias at an edge portion, i.e., a CD bias in a region around ±125 mm is about −5 nm or less. The CD bias is found to gradually decrease from the central portion toward the edge portion. If the CD bias at the central portion and the CD bias at the edge portion are different from each other, uniform etching shapes cannot be formed on the processing target substrate by the etching. In such a case, even if each portion on the processing target substrate is controlled to be uniformly maintained as in Japanese Patent Laid-open Publication No. 2005-100931, the same problem may be caused. Further, even if a ratio of the reactant gas at the central portion to the reactant gas at the edge portion is controlled, the CD bias value at the central portion could mainly be controlled.

DISCLOSURE OF THE INVENTION

Problems to Be Solved by the Invention

In view of the foregoing, the present invention provides a plasma etching apparatus capable of controlling a CD bias of a processing target substrate appropriately during an etching process.

Further, the present invention also provides a plasma etching method capable of controlling a CD bias of a processing target substrate appropriately during an etching process.

In accordance with one aspect of the present invention, there is provided a plasma etching apparatus including: a processing chamber that performs therein a plasma process on a processing target substrate; a mounting table that is provided within the processing chamber and holds the processing target substrate thereon; a first heater that heats a central region of the processing target substrate held on the mounting table; a second heater that heats an edge region around the central region of the processing target substrate held on the mounting table; a reactant gas supply unit that supplies a reactant gas for a plasma process from the central region of the processing target substrate held on the mounting table; and a control unit that performs a plasma etching process on the processing target substrate while controlling the first heater and the second heater to heat the central region and the edge region of the processing target substrate held on the mounting table to different temperatures.

A CD bias may be varied depending on a temperature condition of the processing target substrate. Accordingly, in accordance with the present plasma etching apparatus, when the etching process is performed by supplying a reactant gas toward the central region of the processing target substrate, a CD bias at the central region of the processing target substrate and a CD bias at the edge region thereof can be regulated same by differently setting temperatures of the central region and the edge region of the processing target substrate. Thus, the CD bias on the processing target substrate can be appropriately controlled during the etching process.

Desirably, the control unit may control the first heater and the second heater depending on the reactant gas from the reactant gas supply unit.

More desirably, the control unit may control the first heater and the second heater so as to set a temperature of the edge region to be higher than a temperature of the central region.

Here, the processing target substrate may have a polysilicon layer to be etched, and the control unit may perform a plasma etching process on the polysilicon layer.

In a desirable embodiment, the first heater and the second heater may be embedded in the mounting table, thereby more certainly controlling temperatures of the central region and the edge region of the processing target substrate.

Further, in a desirable embodiment, the mounting table may be of a circular plate shape, and the second heater may be of a ring shape, thereby more appropriately controlling temperatures of the edge region according to a shape of the mounting table.

In accordance with another aspect of the present invention, there is provided a plasma etching method for performing a plasma etching process on a processing target substrate. The plasma etching method includes holding the processing target substrate on a mounting table provided within a processing chamber; and heating a central region and an edge region around the central region of the processing target substrate held on the mounting table to different temperatures, supplying a reactant gas for a plasma process from the central region of the processing target substrate held on the mounting table, and performing the plasma etching process on the processing target substrate.

In accordance with the present plasma etching method, when the etching process is performed by supplying the reactant gas toward the central region of the processing target substrate, a CD bias at the central region of the processing target substrate and a CD bias at the edge region thereof can be regulated same by differently setting temperatures of the central region and the edge region of the processing target substrate. Thus, the CD bias on the processing target substrate can be appropriately controlled during the etching process.

That is, in accordance with the above-described plasma etching apparatus and plasma etching method, when the etching process is performed by supplying the reactant gas toward the central region of the processing target substrate, a CD bias at the central region of the processing target substrate and a CD bias at the edge region thereof can be made same by differently setting temperatures of the central portion and the edge portion of the processing target substrate. Thus, the CD bias on the processing target substrate can be appropriately controlled during the etching process.

In accordance with still another aspect of the present invention, there is provided a plasma processing apparatus including: a processing chamber that performs therein a plasma process on a processing target substrate; a mounting table that is provided within the processing chamber and holds the processing target substrate thereon; a first heater that heats a central region of the processing target substrate held on the mounting table; a second heater that heats an edge region around the central region of the processing target substrate held on the mounting table; a microwave generator that generates a microwave for plasma excitation; a dielectric plate that is provided at a position facing the mounting table and introduces the microwave into the processing chamber; a reactant gas supply unit that supplies a reactant gas for a plasma process to the processing chamber; and a control unit that performs a plasma etching process on the processing target substrate while controlling the first heater and the second heater to heat the central region and the edge region of the processing target substrate held on the mounting table to different temperatures. Here, the mounting table may include a focus ring positioned to surround the processing target substrate held on the mounting table. The reactant gas supply unit may include a first reactant gas supply unit that is provided at a central portion of the dielectric plate and supplies the reactant gas in a directly downward direction toward a central region of the processing target substrate held on the mounting table, and a second reactant gas supply unit that is provided at a position directly above the mounting table but not directly above the processing target substrate held on the mounting table and introduces the reactant gas in a directly downward direction toward the focus ring.

In the plasma processing apparatus having the above-described configuration, the reactant gas can be uniformly supplied to the entire processing target substrate by the first reactant gas supply unit for supplying the reactant gas toward the central region of the processing target substrate and the second reactant gas supply unit for supplying the reactant gas in a directly downward direction toward the focus ring. Further, a stay region where both the reactant gas supplied toward the central region of the processing target substrate and the reactant gas supplied toward the focus ring stay can be a region outside a region directly above the processing target substrate. Moreover, the second reactant gas supply unit may not prevent a flow of the plasma from reaching the processing target substrate. Accordingly, uniformity within the surface of the processing target substrate during the plasma process as well as the appropriate control of the CD bias can be improved. Further, "the region directly above the processing target substrate" refers to an upper region of the processing target substrate in a vertical direction. Here, it does not imply a region strictly vertical above the processing target substrate but implies a region approximately vertical above the processing target substrate.

Desirably, the second reactant gas supply unit may be provided in the vicinity of the mounting table.

More desirably, the second reactant gas supply unit may include a ring-shaped member, and the ring-shaped member may be provided with a supply hole through which the reactant gas is supplied.

More desirably, the processing target substrate may be of a circular plate shape, the ring-shaped member may be of a circular ring shape, and an inner diameter of the ring-shaped member may be larger than an outer diameter of the processing target substrate.

More desirably, the focus ring may be of a circular ring shape, and the supply hole may be provided at a position closer to an inner edge of the focus ring rather than an outer edge of the focus ring.

In accordance with still another aspect of the present invention, there is provided a plasma processing method for performing a plasma process on a processing target substrate. The plasma processing method includes holding the processing target substrate on a mounting table provided within the processing chamber and having a focus ring positioned to surround the processing target substrate held on the mounting table; generating a microwave for plasma excitation; introducing the microwave into the processing chamber through the dielectric plate; performing a control to heat a central region and an edge region of the processing target substrate held on the mounting table to different temperatures; and supplying a reactant gas in a directly downward direction from a central portion of the dielectric plate toward the central region of the processing target substrate, and supplying the reactant gas in a directly downward direction toward the focus ring from a position directly above the mounting table but not directly above the processing target substrate held on the mounting table.

In accordance with the above-described plasma processing apparatus and plasma processing method, the reactant gas can be uniformly supplied to the entire processing target substrate by the first reactant gas supply unit for supplying the reactant gas toward the central region of the processing target substrate and the second reactant gas supply unit for supplying the reactant gas in a directly downward direction toward the focus ring. Further, a stay region where both the reactant gas supplied toward the central region and the reactant gas supplied toward the focus ring stay is not a region directly above the processing target substrate. Moreover, the second reactant gas supply unit may not present a flow of the plasma from reaching the processing target substrate. Accordingly, uniformity within the surface of the processing target substrate during in the plasma process as well as the appropriate control of the CD bias can be improved.

BEST MODE FOR CARRYING OUT THE INVENTION

Hereinafter, embodiments of the present invention will be described with reference to the accompanying drawings.

Figure 1:
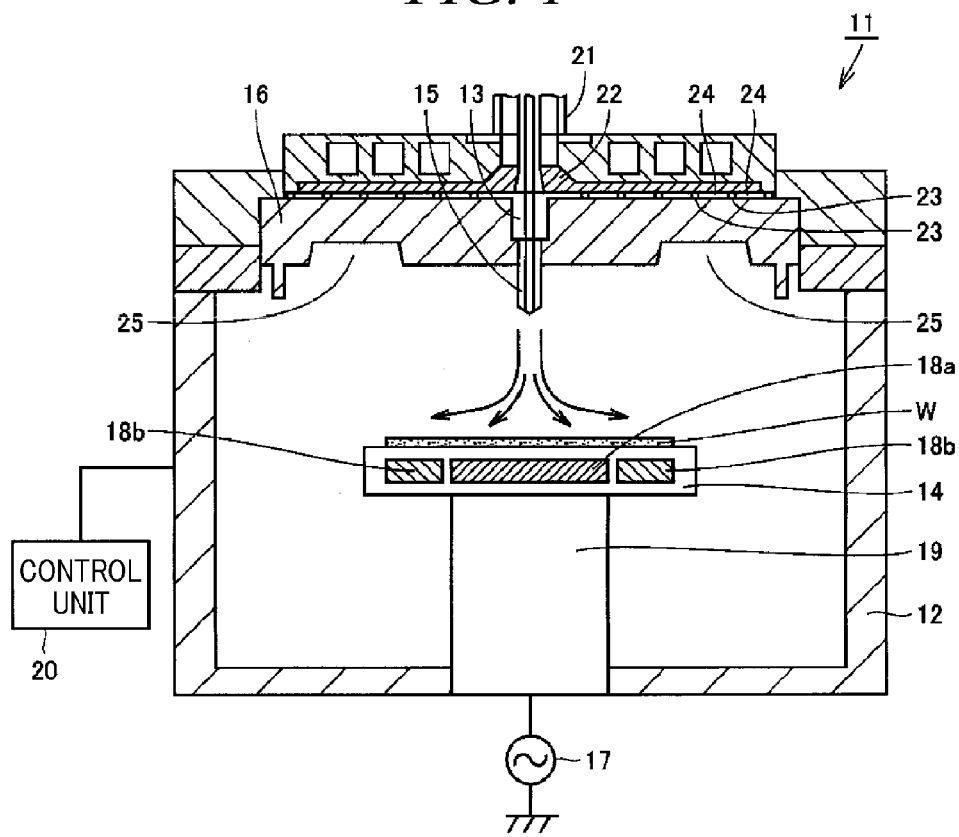
FIG. 1 is a schematic cross sectional view illustrating major parts of a plasma etching apparatus in accordance with an embodiment of the present invention.

FIG. 1 is a schematic cross sectional view illustrating major parts of a plasma etching apparatus in accordance with an embodiment of the present invention. In the drawings, the upside of the paper surface is regarded as an upward direction.

Referring to FIG. 1, a plasma etching apparatus 11 is of a center gas introduction type. The plasma etching apparatus 11 includes a processing chamber 12 configured to perform therein a plasma process on a semiconductor substrate W as a processing target substrate; a reactant gas supply unit 13 having an injector 15 serving as a reactant gas supply port and configured to supply a reactant gas for plasma etching toward a central portion of the semiconductor substrate W; a circular plate-shaped mounting table 14 provided within the processing chamber 12 and configured to hold the semiconductor substrate W thereon; a microwave generator (not shown) including a high frequency power supply (not shown) or the like and configured to generate a microwave for plasma excitation; a dielectric plate 16 positioned to face the mounting table 14 and configured to introduce the microwave generated by the microwave generator into the processing chamber 12; and a control unit 20 configured to control the entire plasma etching apparatus 11. The control unit 20 controls processing conditions for etching the semiconductor substrate W, such as a gas flow rate and an internal pressure of the processing chamber 12. The reactant gas supplied by the reactant gas supply unit 13 flows to the central portion of the semiconductor substrate W and to an edge portion around the central portion at a preset flow rate ratio.

The mounting table 14 is fixed on a top portion of a support column 19 upwardly extending from a bottom portion of the processing chamber 12. The mounting table 14 has an electrostatic chuck structure configured to attract and hold the semiconductor substrate W mounted thereon. For the simplicity of illustration, the electrostatic chuck structure of the mounting table 14 is not illustrated. Further, the mounting table 14 is connected with a high frequency power supply 17 that applies a bias voltage thereto.

The plasma etching apparatus 11 includes a vacuum pump, a gas exhaust pipe (both are not illustrated), and the like, and is capable of depressurizing the inside of the processing chamber 12 to a preset pressure such as a vacuum level. A top portion of the processing chamber 12 is opened, and the processing chamber 12 can be hermetically sealed by the dielectric plate 16 and a sealing member (not shown) provided at the top portion of the processing chamber 12.

The plasma etching apparatus 11 includes a first heater 18*a* and a second heater 18*b* configured to heat the mounting table 14. The first and second heaters 18*a* and 18*b* are embedded in the mounting table 14. The first heater 18*a* is located in a central portion of the circular plate-shaped mounting table 14, while the second heater 18*b* is located outside the first heater 18*a*, i.e., outside of the first heater 18*a* in a diametric direction. The first heater 18*a* is of a circular plate shape, and the second heater 18*b* is of a ring shape. However, the first heater 18*a* may also have a ring shape. Temperatures of the first and second heaters 18*a* and 18*b* can be set differently by the control unit 20. By providing the first and second heaters 18*a* and 18*b* of which temperatures can be controlled independently, the central portion and the edge portion of the semiconductor substrate W held on the mounting table 14 can be regulated to different temperatures.

The plasma etching apparatus 11 includes a waveguide configured to introduce the microwave generated by the microwave generator into the plasma etching apparatus 11; a wavelength shortening plate 22 configured to propagate the microwave; and a circular thin plate-shaped slot antenna 24 configured to introduce the microwave to the dielectric plate through a multiple number of slot holes 23. The dielectric plate 16 is of a circular plate shape made of a dielectric material. A ring-shaped tapered recess 25 is provided on a bottom surface of the dielectric plate 16 to facilitate generation of a standing wave by the introduced microwave.

The microwave generated by the microwave generator is propagated to the wavelength shortening plate 22 through the waveguide 21 and is introduced into the dielectric plate 16 through the slot holes 23 provided in the slot antenna 24. As a result, an electric field is generated within the processing chamber 12, and plasma is generated by plasma ignition.

Now, there will be explained a plasma etching method for a semiconductor substrate W performed by the above-described plasma etching apparatus 11 in accordance with the embodiment of the present invention.

First, a semiconductor substrate W is held on the mounting table 14 as stated above. Then, evacuation by the vacuum pump or the like is performed.

Thereafter, the first and second heaters 18*a* and 18*b* are set to and heated to different temperatures. Here, a setting temperature of the second heater 18*b* is higher than a setting temperature of the first heater 18*a*. As a result, a temperature of an edge portion of the semiconductor substrate W held on the mounting table 14 becomes higher than a temperature of a central portion thereof.

Subsequently, a reactant gas is supplied toward the central portion of the semiconductor substrate W from the injector 15 of the reactant gas supply unit 13, and a microwave for plasma excitation is generated by the microwave generator, and the generated microwave is then introduced into the processing chamber 12 via the dielectric plate 16. As a result, plasma is generated, and a plasma etching process is carried out. As the reactant gas supplied into the processing chamber 12 flows in a direction indicated by an arrow of FIG. 1, an etching process on the entire semiconductor substrate W is carried out.

In this case, since the temperature of the edge portion of the semiconductor substrate W is set to be higher than that of the central portion of the semiconductor substrate W, a CD bias at the central portion and a CD bias at the edge portion can be made substantially same. To elaborate, the CD bias at the edge portion is affected by a reaction product generated by the etching of the central portion, as stated above. However, by controlling the temperatures of the central portion and the edge portion in consideration of the adhesion of the reaction product, the CD bias at the central portion and the CD bias at the edge portion can be made substantially same. Accordingly, it becomes possible to control the CD bias values at the central portion and the edge portion of the semiconductor substrate W appropriately. Further, the setting temperatures may depend on flow rates of the reactant gas, the kind of the reactant gas, and the like.

Figure 2:
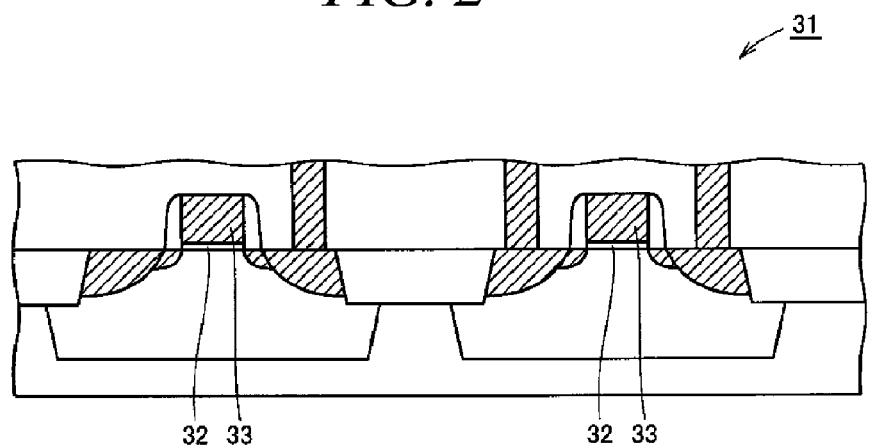
FIG. 2 is a schematic cross sectional view illustrating a part of a semiconductor substrate etched by a plasma etching method in accordance with the embodiment of the present invention.

FIG. 2 is a schematic cross sectional view illustrating a part of a semiconductor substrate 31 fabricated by a manufacturing method involving the plasma etching method in accordance with the embodiment of the present invention. The semiconductor substrate 31 is manufactured through a plurality of processes such as a plasma etching process and a plasma CVD process. For example, the above-described plasma etching process may be performed to form a gate electrode 33 by etching a polysilicon layer formed on a gate oxide film 32 of the semiconductor substrate 31 shown in FIG. 2 by using a gaseous mixture of $HBr/Ar/O_2$.

Figure 3:
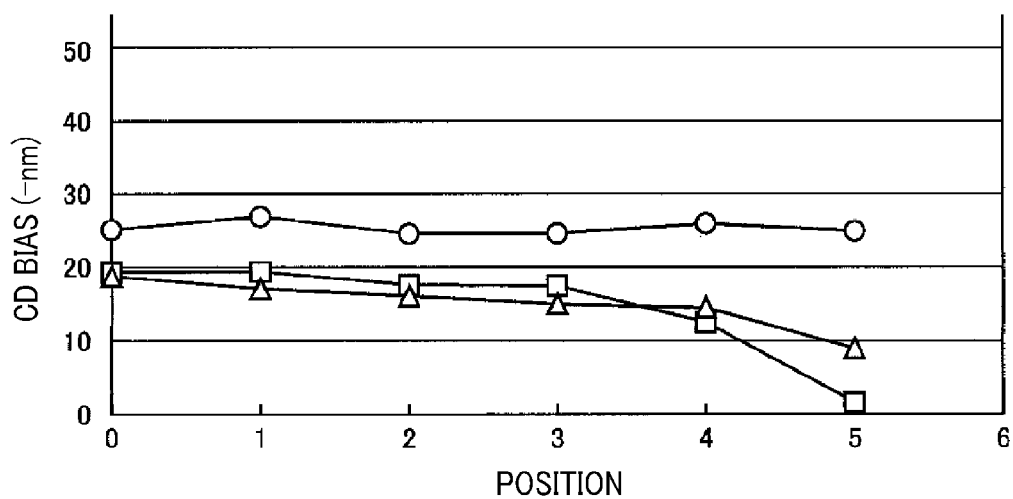
FIG. 3 is a graph showing a relationship between a CD bias and a measurement position when a plasma process is performed while varying temperatures of a central portion and an edge portion of a semiconductor substrate.
Figure 4:
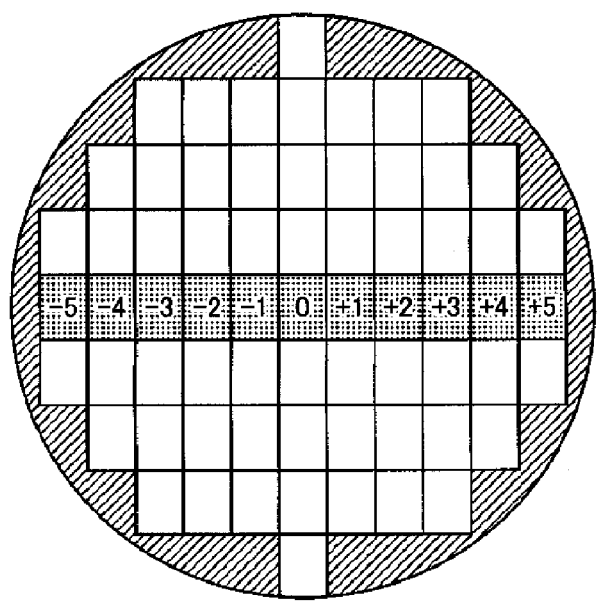
FIG. 4 shows measurement positions of the graph shown in FIG. 3.
Figure 14:
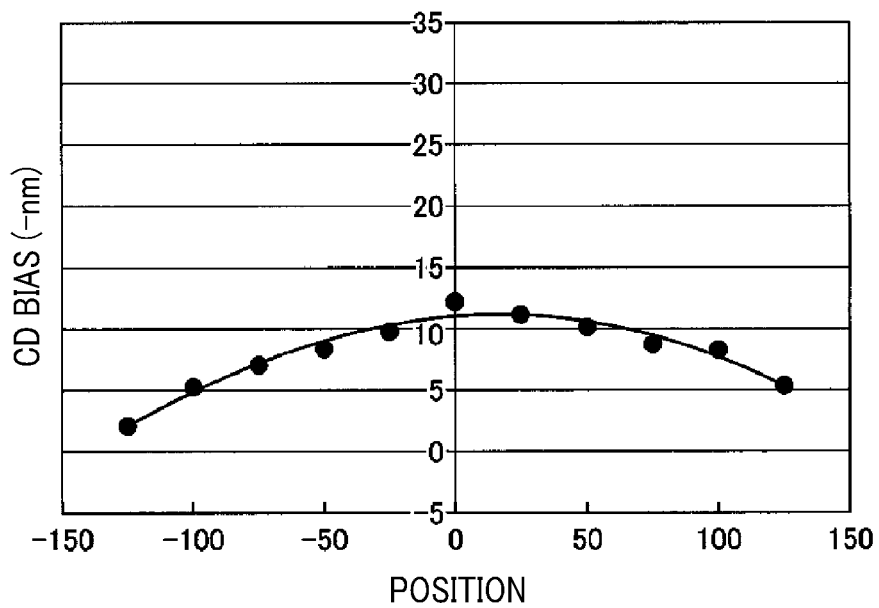
FIG. 14 is a graph showing an example CD bias at each position on a processing target substrate etched by a plasma etching apparatus using a conventional center gas introduction method.

FIG. 3 is a graph showing a relationship between a CD bias and a measurement position when a plasma process is performed while varying temperatures of a central portion and an edge portion of a semiconductor substrate W. In FIG. 3, a mark O represents a case of setting the temperature of the central portion to be about 60° C. and the temperature of the edge portion to be about 75° C.; a mark Δ represents a case of setting the temperatures of the central portion and the edge portion to be about 60° C.; a mark □ represents a case of setting the temperature of the central portion to be about 60° C. and the temperature of the edge portion to be about 50° C. A vertical axis indicates a CD bias (−nm), and a horizontal axis indicates a position on the semiconductor substrate W. Here, measurement positions on the semiconductor substrate W are illustrated in FIG. 4. FIG. 4 shows CD bias measurement positions when the mounting table 14 is viewed from the top. Referring to FIG. 14, a central region of the semiconductor substrate W held on the mounting table 14 is defined as a center 0, and regions between the center 0 and each of two opposite end portions are divided into five regions. A CD bias is measured at each point of 0 to +5.

Referring to FIGS. 3 and 4, when the temperature of the edge portion is set to be lower than the temperature of the central portion by setting the temperature of the edge portion to be about 50° C. and the temperature of the central portion to be about 60° C. and, also, when the temperatures of the central portion and the edge portion are set to be same by setting both temperatures to be about 60° C., a CD bias is found to decrease from the edge portion toward the central portion, as indicated by the marks Δ and □ in FIG. 3. However, when the temperature of the edge portion is set to be higher than the temperature of the central portion by setting the temperature of the edge portion to be about 75° C. and the temperature of the central portion to be about 60° C., a CD bias is found to be substantially stabilized in the whole range from the edge portion to the central portion, as indicated by the marks O in FIG. 3. That is, CD bias values are almost same on the entire surface of the semiconductor substrate W including the edge portion and the central portion. Thus, uniformity of the CD bias in a surface of the semiconductor substrate W can be achieved.

As described above, when the etching process is performed by supplying the reactant gas toward the central portion of the semiconductor substrate W, the CD bias at the central portion and the CD bias at the edge portion can be made substantially same by setting the temperature of the edge portion of the semiconductor substrate W to be higher than the temperature of the central portion thereof. Accordingly, the CD bias on the semiconductor substrate W during the etching process can be appropriately controlled.

In the present embodiment, since the first and second heaters 18a and 18b are embedded in the mounting table 14, the temperatures of the central portion and the edge portion of the semiconductor substrate W held on the mounting table 14 can be controlled more effectively.

Further, since the second heater 18b has the ring shape corresponding to the circular plate shape of the mounting table 14, the temperature of the edge portion can be more appropriately controlled.

Moreover, in the above-described embodiment, although the temperature of the edge portion is controlled to be higher than the temperature of the central portion, it may be also possible to uniform the CD bias by setting the temperature of the edge portion to be lower than the temperature of the central portion depending on conditions such as the kind of the reactant gas. By way of example, depending on a generated plasma state, a CD bias at the edge portion may become greater than a CD bias at the central portion in a state that the temperatures of the edge portion and the central portion are set to be same. In such a case, for example, by performing a plasma etching process while controlling the temperature of the edge portion to be lower than the temperature of the central portion, CD bias values at respective positions on the surface of the semiconductor substrate W can be uniformed.

Furthermore, although the above embodiment has been described for the case of etching the polysilicon layer, the present invention is not limited thereto and can also be applied to a case of etching a target object such as a $SiO_2$ layer or a metal layer formed on a semiconductor substrate.

In addition, the present invention is also applicable to a case of using, for example, a hafnium (Hf)-containing gas, a hafnium oxide-based gas, a ruthenium (Ru)-containing gas or the like as the reactant gas for the etching process.

Moreover, in the above-described embodiment, although the first and second heaters are embedded in the mounting table, they may be provided outside the mounting table, e.g., at an outer peripheral portion of the mounting table or under the mounting table.

Further, in the above-described embodiment, although the mounting table is of the circular plate shape, the mounting table may have another shape. Furthermore, the first or second heater may be divided in a circumferential direction, and the first heater or the second heater may be made up of a multiple number of heaters. Moreover, the second heater may have at least dual structure along the circumferential direction. That is, the second heater may include a plurality of heaters, having different diameters, arranged outside the first heater. The first heater may also have at least dual structure along the circumferential direction.

Furthermore, in the above-described embodiment, the plasma etching apparatus has a configuration for supplying the reactant gas only toward the central portion of the semiconductor substrate W to be processed. However, in order to improve uniformity within a surface of the semiconductor substrate during the plasma process as well as an appropriate control of the CD bias, the plasma etching apparatus may have a configuration for supplying the reactant gases toward both the central portion and the edge portion of the semiconductor substrate.

Figure 5:
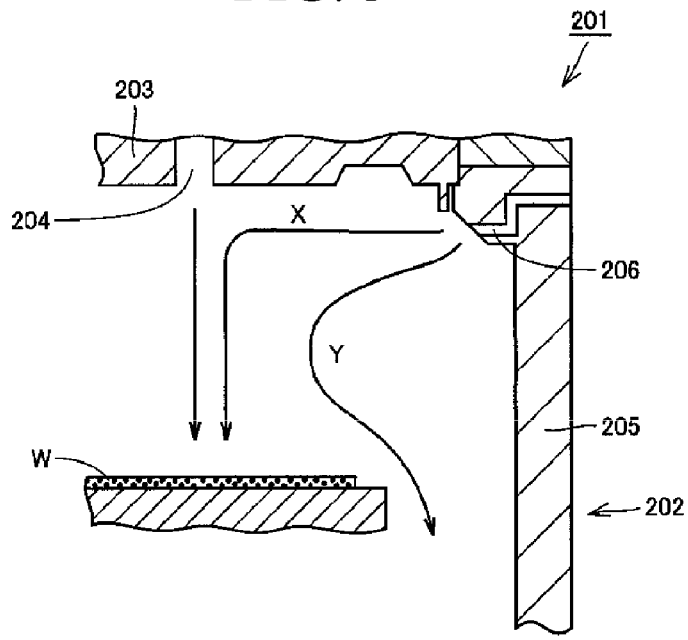
FIG. 5 is a schematic cross sectional view illustrating a part of a plasma processing apparatus having a conventional configuration in which two reactant gas supply units for supplying a reactant gas into a processing chamber are provided at two different positions.

Now, a plasma etching apparatus having a configuration for supplying reactant gases toward both a central portion and an edge portion of a semiconductor substrate will be explained. FIG. 5 is a schematic cross sectional view illustrating a part of a plasma processing apparatus 201 in which two reactant gas supply units for supplying reactant gases into a processing chamber are provided at two different positions. In the plasma processing apparatus 201 shown in FIG. 5, in order to supply a reactant gas to a central region of a circular plate-shaped processing target substrate W, a first reactant gas supply unit 204 is provided at a central portion of a dielectric plate 203 which introduces a microwave into a processing chamber 202. The first reactant gas supply unit 204 jets the reactant gas toward the central region of the processing target substrate W. Further, in order to supply the reactant gas to an edge region of the processing target substrate W, a second reactant gas supply unit 206 is provided at an upper portion of a sidewall 205 of the processing chamber 202. In the plasma processing apparatus 201 during a plasma process, evacuation is performed in a downward direction by a gas exhaust unit (not shown) located at a lower side of FIG. 5.

In the plasma processing apparatus 201 in which the reactant gas supply units are provided at the two different positions as described above, when the reactant gas is supplied into the processing chamber 202 at a pressure range (equal to or larger than about 50 mTorr) of a viscous flow, the reactant gas supplied from the second reactant gas supply unit 206 is affected by the first reactant gas supply unit 204 and flows toward the central portion, as indicated by an arrow X of FIG. 5. That is, the reactant gas from the second reactant gas supply unit 206 flows along the same supply path as that of the reactant gas from the first reactant gas supply unit 204. Accordingly, an effect of supplying the reactant gas from the second reactant gas supply unit 206 is not much. The reactant gas supplied to the central region of the processing target substrate W is diffused in a radial direction from the central region toward the edge region of the processing target substrate. As the reactant gas flows toward the edge region, the reactant gas is consumed and a reaction product increases. As a result, distribution of a processed state on the processing target substrate W is not uniform in a diametric direction of the processing target substrate W, resulting in non-uniformity of a processed surface.

Meanwhile, at a pressure range (equal to or less than about 50 mTorr) of a molecular flow, the reactant gas supplied from the second reactant gas supply unit 206 flows in a downward direction, as indicated by an arrow Y of FIG. 5, due to the evacuation by the gas exhaust unit. Accordingly, the reactant gas supplied from the second reactant gas supply unit 206 is exhausted without reaching the processing target substrate W. As a result, only the reactant gas from the first reactant gas supply unit 204 reaches the processing target substrate W. Thus, as in the aforementioned case, non-uniformity within the surface in the processing state of the processing target substrate W may be caused.

As stated above, in the plasma processing apparatus 201, even if a supply amount of the gas from the second reactant gas supply unit 206 is adjusted by varying the internal pressure of the processing chamber 202, the reactant gas may not be uniformly supplied to the processing target substrate W. Thus, it is difficult to achieve uniformity within the surface of the processing target substrate W during the plasma process.

Figure 6:
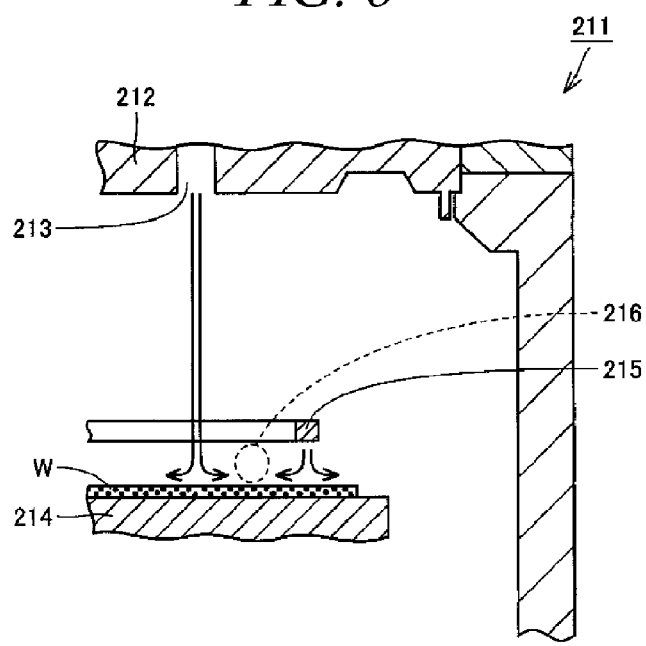
FIG. 6 is a schematic cross sectional view of a plasma processing apparatus in which a second reactant gas supply unit is provided in a region directly above a processing target substrate W, and FIG. 6 corresponds to the cross sectional view illustrated in FIG. 5.

Here, in case that the second reactant gas supply unit is provided in a region directly above the processing target substrate W so as to supply the reactant gas to the processing target substrate W uniformly, the following problems may be caused. FIG. 6 is a schematic cross sectional view showing a part of a plasma processing apparatus 211 having such a configuration, and FIG. 6 corresponds to the cross section illustrated in FIG. 5. As shown in FIG. 6, in the plasma processing apparatus 211, a first reactant gas supply unit 213 is provided in a central portion of a dielectric plate 212, and a ring-shaped second reactant gas supply unit 215 is provided in a region directly above a processing target substrate W held on a mounting table 214. A reactant gas is supplied to an edge region of the processing target substrate W by the second reactant gas supply unit 215.

With this configuration, however, the reactant gas supplied from the first reactant gas supply unit 213 and the reactant gas supplied from the second reactant gas supply unit 215 may collide with each other in a region 216 between the central region and the edge region of the processing target substrate W in a diametric direction. In FIG. 6, the region 216 is marked by a dashed line. The reactant gas may stay in this region 216, thus resulting in stay of a deposit (reaction product).

Further, as shown in FIG. 6, if the second reactant gas supply unit 215 is provided in the region directly above the processing target substrate W, the second reactant gas supply unit 215 may become a plasma shield that blocks a flow of plasma above the processing target substrate W. Such a plasma shield may cause non-uniformity of plasma above the processing target substrate W.

Due to the stay of the deposit and the presence of the plasma shield as mentioned above, an etching rate of the processing target substrate W in the region 216 and an etching rate of the processing target substrate W in the central region or the edge region become different, resulting in deterioration of uniformity within the surface of the processing target substrate W during the plasma process.

Figure 7:
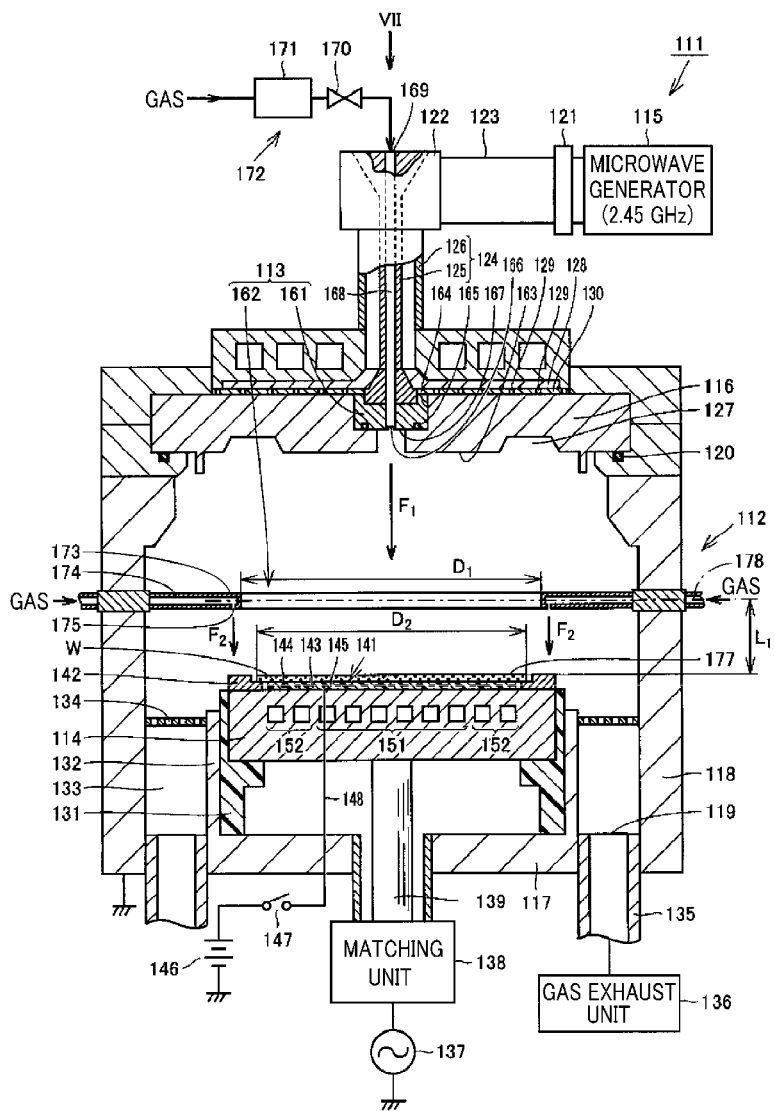
FIG. 7 is a schematic cross sectional view illustrating major parts of a plasma processing apparatus in accordance with another embodiment of the present invention.

Thus, to solve the aforementioned problems, the following configuration may be desirable. FIG. 7 is a cross sectional view illustrating a part of a plasma etching apparatus having such a desirable configuration. Referring to FIG. 7, a plasma processing apparatus 111 includes a processing chamber 112 configured to perform therein a plasma process on a processing target substrate W; a reactant gas supply unit 113 configured to supply a reactant gas for the plasma process into the processing chamber 112; a circular plate-shaped mounting table 114 configured to hold the processing target substrate W thereon; a first heater 151 configured to heat a central region of the processing target substrate W held on the mounting table 114; a second heater 152 configured to heat an edge region around the central region of the processing target substrate W held on the mounting table 114; a microwave generator 115 configured to generate a microwave for plasma excitation; a dielectric plate 116 positioned to face the mounting table 114 and configured to introduce the microwave generated by the microwave generator 115 into the processing chamber 112; and a control unit (not shown) that performs a plasma etching process on the processing target substrate W while controlling the first and second heaters 151 and 152 to heat the central region and the edge region of the processing target substrate W to different temperatures and also controls the entire plasma processing apparatus 111. The control unit controls processing conditions for the plasma process of the processing target substrate W, such as a gas flow rate in the reactant gas supply unit 113 and an internal pressure of the processing chamber 112.

The processing chamber 112 includes a bottom 117 positioned under the mounting table 114; and a sidewall 118 extending upwardly from the periphery of the bottom 117. The sidewall 118 is of a cylindrical shape. A gas exhaust hole 119 for gas exhaust is provided in the bottom 117 of the processing chamber 112. A top portion of the processing chamber 112 is opened, and the processing chamber 112 can be hermetically sealed by the dielectric plate 116 provided at the top portion of the processing chamber 112 via an O-ring 120 as a sealing member provided between the dielectric plate 116 and the processing chamber 112.

The microwave generator 115 having a matching device 121 is connected to an upper portion of a coaxial waveguide 124 for introducing a microwave via a mode converter 122 and a waveguide 123. For example, a microwave of a TE mode generated by the microwave generator 115 is converted to a TEM mode by the mode converter 122 after it passes through the waveguide 123. Then, the microwave of the TEM mode propagates through the coaxial waveguide 124. The coaxial waveguide 124 includes a central conductor 125 provided at a center thereof in a diametric direction; and an external conductor 126 provided at a periphery of the central conductor 125 in a diametric direction. An upper end portion of the central conductor 125 is connected to a ceiling partition wall of the mode converter 122. A frequency of the microwave generated by the microwave generator 115 is, for example, about 2.45 GHz. Further, the waveguide 123 may have a circular or a rectangular cross section.

The dielectric plate 116 is of a circular plate shape made of a dielectric material. A ring-shaped tapered recess 127 is provided on a bottom surface of the dielectric plate 116 to facilitate generation of a standing wave by the introduced microwave. Due to the recess 127, plasma can be efficiently generated under the dielectric plate 116 by the microwave. Further, the dielectric plate 116 may be made of a material such as quartz or alumina.

Further, the plasma processing apparatus 111 includes a wavelength shortening plate 128 configured to propagate the microwave introduced through the coaxial waveguide 124; and a circular shaped thin slot plate 130 configured to introduce the microwave to the dielectric plate 116 through a multiple number of slot holes 129. The microwave generated by the microwave generator 115 is propagated to the wavelength shortening plate 128 through the coaxial waveguide 124 and is then introduced to the dielectric plate 116 through the slot holes 129 provided in the slot plate 130. The microwave transmitted through the dielectric plate 116 generates an electric field directly under the dielectric plate 116. As a result, plasma is generated within the processing chamber 112.

The mounting table 114 also serves as a high frequency electrode and is supported by a cylindrical insulating support 131 extending vertically upward from the bottom 117. A ring-shaped gas exhaust passageway 133 is formed between the sidewall 118 of the processing chamber 112 and a cylindrical conductive support 132 extending vertically upward from the bottom 117 along the outer periphery of the cylindrical support 131. A ring-shaped baffle plate 134 provided with a multiple number of through holes is fixed to an upper portion of the gas exhaust passageway 133. A gas exhaust unit 136 is connected to a bottom portion of the gas exhaust hole 119 via a gas exhaust pipe 135. The gas exhaust unit 136 has a vacuum pump such as a turbo molecular pump. The inside of the processing chamber 112 can be depressurized to a desired vacuum level by the gas exhaust unit 136.

The mounting table 114 is electrically connected with a high frequency RF bias power supply 137 via a matching unit 138 and a power supply rod 139. The high frequency power supply 137 outputs a high frequency power of a certain frequency (e.g., about 13.56 MHz) suitable for controlling energy of ions attracted into the processing target substrate W. The matching unit 138 has a matching device for matching impedance on the side of the high frequency power supply 137 with impedance on the side of a load such as an electrode, plasma and the processing chamber 112. A blocking capacitor for generation of self-bias is incorporated in the matching device.

An electrostatic chuck 141 configured to hold the processing target substrate W by an electrostatic attracting force is provided on a top surface of the mounting table 114. Further, a focus ring 142 is provided at a periphery of the electrostatic chuck 141 in a diametric direction to surround the processing target substrate W in a ring shape. That is, the mounting table 114 includes the focus ring 142 provided around the processing target substrate W held on the mounting table 114. The focus ring 142 is of a circular ring shape. The electrostatic chuck 142 is configured such that an electrode 143 made of a conductive film is sandwiched between a pair of insulating films 144 and 145. A high voltage DC power supply 146 is electrically connected with the electrode 143 via a switch 147 and a coated line 148. The processing target substrate W can be attracted to and held on the electrostatic chuck 141 by a Coulomb force generated by a DC voltage applied from the DC power supply 146.

A first heater 151 and a second heater 152 are provided within the mounting table 114. The first heater 151 heats the central region of the processing target substrate W held on the mounting table 114, thus regulating a temperature of the central region of the processing target substrate W to a preset temperature. In this embodiment, the first heater 151 has a triple structure in a diametric direction. The second heater 152 heats the edge region of the processing target substrate W held on the mounting table 114, thus regulating a temperature of the edge region of the processing target substrate W to a certain temperature. In this embodiment, the second heater 152 has a dual structure in a diametric direction. A heat transfer gas or a coolant at a preset temperature is supplied and circulated into each of the first and second heaters 151 and 152 from a chiller unit (not shown) through a pipe (not shown). In this way, the temperatures of the central region and the edge region of the processing target substrate W are regulated to different temperatures.

Now, a specific configuration of the reactant gas supply unit 113 for supplying a reactant gas for the plasma process into the processing chamber 112 will be elaborated. The reactant gas supply unit 113 includes a first reactant gas supply unit 161 configured to supply the reactant gas in a directly downward direction toward the central region of the processing target substrate W; and a second reactant gas supply unit 162 configured to supply a reactant gas in a directly downward direction toward the focus ring 142. To elaborate, the first reactant gas supply unit 161 supplies the reactant gas in a direction indicated by an arrow $F_1$ of FIG. 7, while the second reactant gas supply unit 162 supplies the reactant gas in a direction indicted by an arrow $F_2$ of FIG. 7. The same kind of reactant gas is supplied to the first and second reactant gas supply units 161 and 162 from the same reactant gas supply source (not shown).

The first reactant gas supply unit 161 is provided at a center of the dielectric plate 116 in a diametric direction and is located at an inner position of the dielectric plate 116 recessed from a bottom surface 163 of the dielectric plate 116 facing the mounting table 114. With this arrangement, an abnormal electric discharge that might be caused by electric field concentrated to the first reactant gas supply unit 161 can be avoided. The dielectric plate 116 is provided with an accommodation member 164 for accommodating the first reactant gas supply unit 161 therein. An O-ring 165 is provided between the first reactant gas supply unit 161 and the accommodation member 164 so as to secure airtightness of the inside of the processing chamber 112.

The first reactant gas supply unit 161 is provided with a multiple number of supply holes 166 through which a reactant gas is jetted in a directly downward direction toward the central region of the processing target substrate W. The supply holes 166 are provided in an area of the wall surface 167 facing the mounting table 114 and the area is exposed to the inside of the processing chamber 112. Further, the wall surface 167 is flat. The supply holes 166 are provided in the first reactant gas supply unit 161 to be located at a center of the dielectric plate 116 in a diametric direction.

The plasma processing apparatus 111 is provided with a gas flow path 168 formed through the central conductor 125 of the coaxial waveguide 124, the slot plate 130 and the dielectric plate 116 to reach the supply holes 166. A gas supply system 172 including an opening/closing valve 170 or a flow rate controller 171 such as a mass flow controller is connected to a gas inlet 169 formed at an upper end portion of the central conductor 125. The reactant gas is supplied while its flow rate is controlled by the gas supply system 172.

The second reactant gas supply unit 162 includes a circular ring-shaped member 173 made of a pipe-shaped member. The inside of the ring-shaped member 173 is configured as a flow path of the reactant gas. The ring-shaped member 173 is positioned between the mounting table 114 and the dielectric plate 116 within the processing chamber 112. The second reactant gas supply unit 162 is located in a region directly above the mounting table 114 but not located directly above the processing target substrate W held on the mounting table 114. Specifically, assuming that an inner diameter of the circular ring-shaped member 173 is defined as $D_1$ and an outer diameter of the processing target substrate W is defined as $D_2$, the inner diameter $D_1$ of the ring-shaped member 173 is set to be larger than the outer diameter $D_2$ of the processing target substrate W. For example, $D_1$ is about 400 mm. Further, the ring-shaped member 173 is located directly above the focus ring 142. The ring-shaped member 173 is supported by a support 174 extending inward from the sidewall 118 of the processing chamber 112. The support 174 has a hollow region therein.

Figure 8:
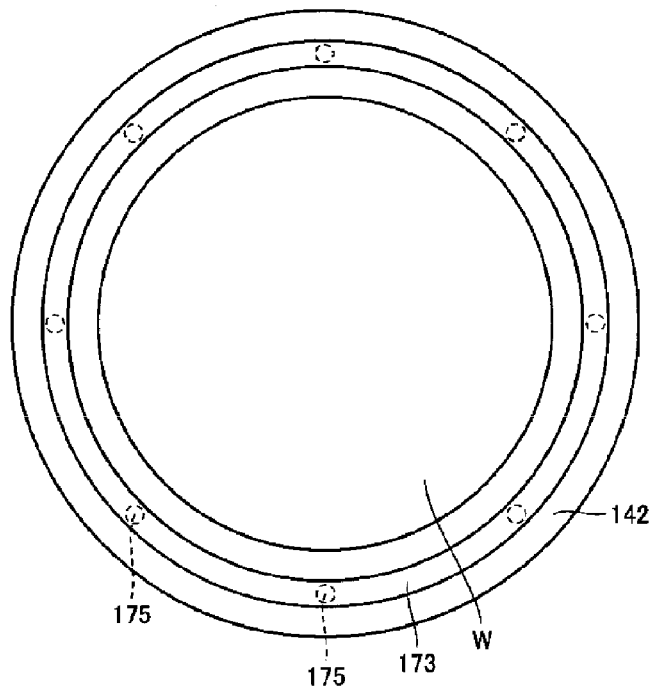
FIG. 8 illustrates the vicinity of a ring-shaped member of a second reactant gas supply unit included in the plasma processing apparatus of FIG. 7, when viewed from an arrow VII of FIG. 7.

The ring-shaped member 173 is provided with a multiple number of supply holes 175 through which the reactant gas is jetted in a directly downward direction toward the focus ring 142 located outside the processing target substrate W. Each supply hole 175 has a circular shape. The supply holes 175 are provided in a lower part of the ring-shaped member 173 and are arranged at a regular distance from each other along a circumference of the ring-shaped member 173. Further, FIG. 8 illustrates the vicinity of the ring-shaped member 173 included in the second reactant gas supply unit 162 shown in FIG. 7, when viewed from an arrow VII of FIG. 7. In this embodiment, eight supply holes 175 are illustrated.

The reactant gas supplied from the outside of the plasma processing apparatus 111 is introduced into the processing chamber 112 from the supply holes 175 of the ring-shaped member 173 after passing through the inside of the support 174. A gas supply system (not shown) including an opening/closing value or a flow rate controller as described above is also provided outside the support 174.

Desirably, the second reactant gas supply unit 162 may be provided in the vicinity of the mounting table 114. To elaborate, within the processing chamber 112, the ring-shaped member 173 may be provided in a low-plasma-density region called a downflow region which is hardly affected by the flow of the reactant gas supplied from the first reactant gas supply unit 161. A distance $L_1$ between a top surface 177 of the processing target substrate W held on the mounting table 114 and a vertical center 178 of the ring-shaped member 173 indicated by a dashed dotted line of FIG. 7 may be, e.g., about 200 mm.

Furthermore, the supply holes 175 provided in the ring-shaped member 173 may be formed at positions closer to an inner edge of the focus ring 142 rather than an outer edge thereof.

Now, there will be explained a method for performing a plasma process on the processing target substrate W by using the plasma processing apparatus 111 in accordance with the embodiment of the present invention.

First, the processing target substrate W is held on the electrostatic chuck 141 of the mounting table 114 installed in the processing chamber 112. In this case, the focus ring 142 is positioned to surround the processing target substrate W. Then, a central portion and an edge portion of the processing target substrate W are controlled to different temperatures by the first and second heaters 151 and 152, respectively. Thereafter, a microwave for exciting plasma is generated by the microwave generator 115. Subsequently, the microwave is introduced into the processing chamber 112 through the dielectric plate 116 or the like. Then, a reactant gas is supplied in a directly downward direction from the central portion of the dielectric plate 116 toward the central region of the processing target substrate W through the supply holes 166 of the first reactant gas supply unit 161. Further, a reactant gas is supplied in a directly downward direction toward the focus ring 142 through the supply holes 175 of the ring-shaped member 173 of the second reactant gas supply unit 162. In this way, a plasma process is performed on the processing target substrate W.

In accordance with the plasma processing apparatus 111 and the plasma processing method as described above, the reactant gas can be uniformly supplied to the entire processing target substrate W by the first reactant gas supply unit 161 that supplies the reactant gas in the directly downward direction toward the central region of the processing target substrate W and the second reactant gas supply unit 162 that supplies the reactant gas in the directly downward direction toward the focus ring 142. Moreover, the reactant gases supplied toward the central region of the processing target substrate W and toward the focus ring 142 are made to stay in a region other than just above the processing target substrate W, e.g., in a region outside an edge of the processing target substrate W. Furthermore, the second reactant gas supply unit 162 does not prevent a flow of plasma from reaching the processing target substrate W. Accordingly, uniformity within the surface of the processing target substrate W during the plasma process as well as an appropriate control of a CD bias can be improved.

Figure 9:
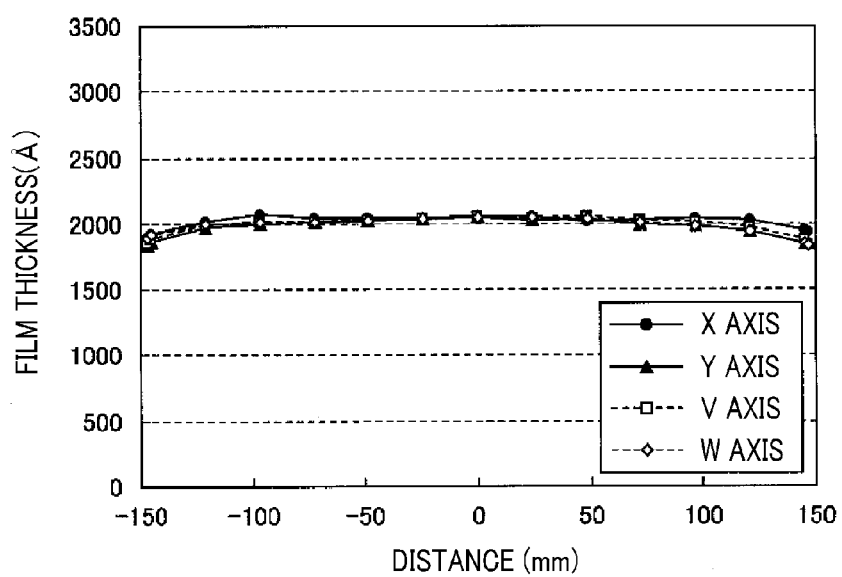
FIG. 9 is a graph showing a relationship between a film thickness and a position on a processing target substrate W when film formation is performed on the processing target substrate W in the plasma processing apparatus in accordance with another embodiment of the present invention.
Figure 10:
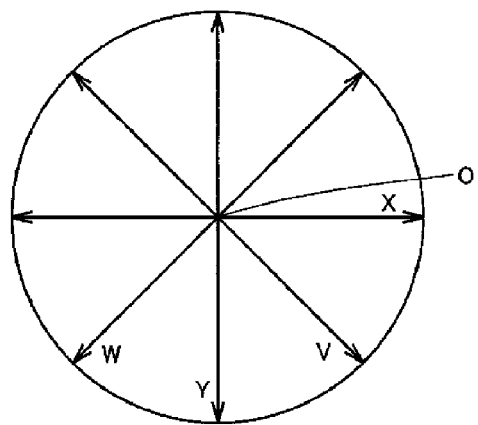
FIG. 10 is a diagram showing an X axis, a Y axis, a V axis and a W axis on the processing target substrate W, shown in FIG. 9.
Figure 11:
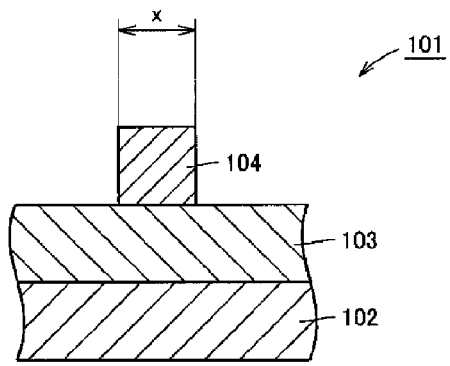
FIG. 11 is a schematic cross sectional view illustrating a part of a semiconductor substrate before an etching process is performed.
Figure 12:
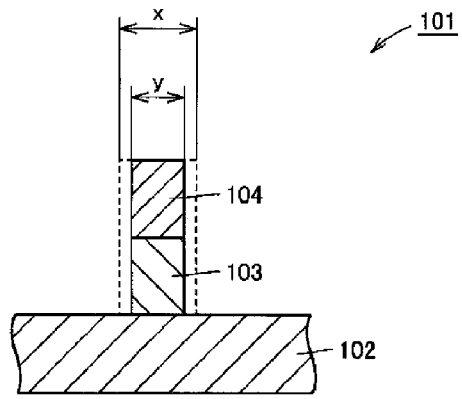
FIG. 12 is a schematic cross sectional view illustrating a part of the semiconductor substrate after the etching process is performed.
Figure 13:
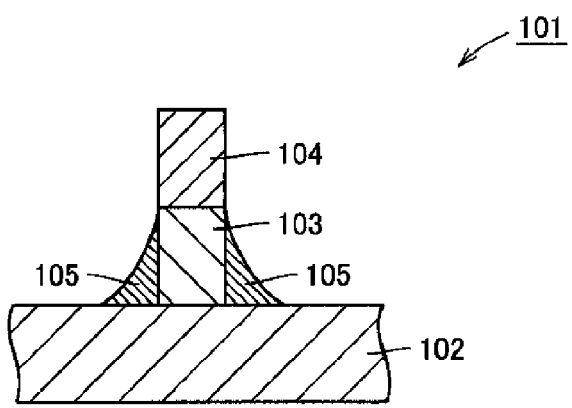
FIG. 13 is a schematic cross sectional view illustrating a part of the semiconductor substrate on which a reaction product is deposited during the etching process.

FIG. 9 is a graph showing a relationship between a film thickness and a position on a processing target substrate when a film is formed on the processing target substrate W in the plasma processing apparatus 111 in accordance with the embodiment of the present invention. In FIG. 9, a vertical axis represents a film thickness (Å), and a horizontal axis represents a distance (mm) from a center 0. Further, FIG. 10 illustrates an X axis, a Y axis, a V axis and a W axis shown in FIG. 9 on the processing target substrate W. In FIG. 9, a ratio between a gas supply amount from the first reactant gas supply unit 161 and a gas supply amount from the second reactant gas supply unit 162 is about 22:78. In such a case, an inner diameter of the ring-shaped member 173 is about 400 mm, and a distance $L_1$ as shown in FIG. 7 is about 90 mm. For other processing conditions, a pressure is set to about 100 mTorr; a flow rate of an argon gas, about 1000 sccm; a flow rate of a HBr gas, about 600 sccm; a flow rate of an oxygen gas, about 4 sccm; a chiller temperature, about 10° C.; a temperature of a central region about 60° C. and a temperature of an edge region about 80° C. That is, on the edge region in which an etching shape tends to have a relatively larger thickness, adhesion of a reaction product is reduced by increasing the temperature, thus increasing a CD bias, i.e., reducing the thickness of the etching shape. On the other hand, on the central region in which an etching shape tends to have a relatively smaller thickness, adhesion of a reaction product is increased by reducing the temperature, thus reducing a CD bias, i.e., increasing the thickness of the etching shape.

As can be seen from FIG. 9, although a film thickness on the central region of the processing target substrate W is slightly larger than a film thickness on the edge region thereof, the film thicknesses are almost stabilized and uniform. That is, uniformity in the surface is high.

Here, in the conventional plasma processing apparatus as described in FIG. 6, a plasma process on a surface of the processing target substrate W cannot be changed by adjusting a ratio of gas supply amounts. That is, in the conventional plasma processing apparatus as illustrated in FIG. 6, a processing degree in a surface of the processing target substrate W hardly changes even if the ratio of the gas supply amounts is adjusted.

Moreover, in the plasma processing apparatus in accordance with the present invention, since respective components of the second reactant gas supply unit 162 are provided at positions other than directly above the processing target substrate W, fatigue of each component of the second reactant gas supply unit 162 due to plasma can be reduced. Thus, lifetime of the second reactant gas supply unit 162 can be lengthened.

Although the embodiments of the present invention has been described with reference to the accompanying drawings, the present invention is not limited thereto, and various changes and modifications can be made without departing from the scope of the present invention.

INDUSTRIAL APPLICABILITY

A plasma etching apparatus and a plasma etching method in accordance with the present invention has many advantages when an appropriate control of a CD bias on a processing target substrate is required in an etching process.

What is claimed is:
1. A plasma etching apparatus comprising:
a processing chamber that performs therein a plasma process on a processing target substrate;
a mounting table that is provided within the processing chamber and holds the processing target substrate thereon;
a first heater that heats a central region of the processing target substrate held on the mounting table;
a second heater that heats an edge region around the central region of the processing target substrate held on the mounting table;
a microwave generator that generates a microwave for plasma excitation;

a dielectric plate that is provided at a position facing the mounting table and introduces the microwave generated by the microwave generator into the processing chamber;

a reactant gas supply unit that supplies a reactant gas for a plasma process toward only the central region of the processing target substrate held on the mounting table; and a control unit that performs a plasma etching process on the processing target substrate while controlling the first heater and the second heater to heat the central region and the edge region of the processing target substrate held on the mounting table to different temperatures, wherein a CD (Critical Dimension) bias at the edge region of the processing target substrate is affected by a reaction product generated by the plasma etching process performed on the central region of the processing target substrate, and the control unit is configured to control the first heater and the second heater in consideration of the reaction product, such that a CD bias at the central region of the processing target substrate and the CD bias at the edge region of the processing target substrate are substantially the same, wherein the reactant gas supply unit is located in an upper recess formed in an upper surface of the dielectric plate, with a bottom surface of the reactant gas supply unit being recessed from a bottom surface of the dielectric plate, such that a processing space between the processing target substrate and the dielectric plate is extended to the bottom surface of the reactant gas supply unit recessed from the bottom surface of the dielectric plate, and a sealing member is provided between a bottom surface of the reactant gas supply unit and an upper surface of a part of the dielectric plate supporting the reactant gas supply unit.

2. The plasma etching apparatus of claim 1, wherein the control unit controls the first heater and the second heater depending on the reactant gas from the reactant gas supply unit.

3. The plasma etching apparatus of claim 1, wherein the control unit controls the first heater and the second heater so as to set a temperature of the edge region to be higher than a temperature of the central region.

4. The plasma etching apparatus of claim 1, wherein the processing target substrate has a polysilicon layer to be etched, and the control unit performs a plasma etching process on the polysilicon layer.

5. The plasma etching apparatus of claim 1, wherein the first heater and the second heater are embedded in the mounting table.

6. The plasma etching apparatus of claim 1, wherein the mounting table is of a circular plate shape, and the second heater is of a ring shape.

7. A plasma etching method for performing a plasma etching process on a processing target substrate, the method comprising:

holding the processing target substrate on a mounting table provided within a processing chamber;

generating a microwave for plasma excitation;

introducing the microwave generated by a microwave generator into the processing chamber through a dielectric plate provided at a position facing the mounting table;

heating a central region and an edge region around the central region of the processing target substrate held on the mounting table to different temperatures;

supplying a reactant gas for a plasma process from a reactant gas supply unit located in an upper recess formed in an upper surface of the dielectric plate, with a bottom surface of the reactant gas supply unit being recessed from a bottom surface of the dielectric plate, such that a processing space between the processing target substrate and the dielectric plate is extended to the bottom surface of the reactant gas supply unit recessed from the bottom surface of the dielectric plate, toward only the central region of the processing target substrate held on the mounting table, the reactant gas supply unit being secured to the dielectric plate by a sealing member provided between a bottom surface of the reactant gas supply unit and an upper surface of a part of the dielectric plate supporting the reactant gas supply unit; and performing the plasma etching process on the processing target substrate while heating the central region and the edge region of the processing target substrate held on the mounting table to different temperatures, wherein a CD (Critical Dimension) bias at the edge region of the processing target substrate is affected by a reaction product generated by the plasma etching process performed on the central region of the processing target substrate, and the first heater and the second heater are controlled in consideration of the reaction product, such that a CD bias at the central region of the processing target substrate and the CD bias at the edge region of the processing target substrate are substantially the same.

* * * * *

UNITED STATES PATENT AND TRADEMARK OFFICE
CERTIFICATE OF CORRECTION

| | | |
|---|---|---|
| PATENT NO. | : 9,263,298 B2 | Page 1 of 1 |
| APPLICATION NO. | : 12/919293 | |
| DATED | : February 16, 2016 | |
| INVENTOR(S) | : Naoki Matsumoto et al. | |

It is certified that error appears in the above-identified patent and that said Letters Patent is hereby corrected as shown below:

On the title page item 74, please change the Attorney, Agent, or Firm from "Pearner & Gordon LLP" to -- Pearne & Gordon LLP --.

On the title page item 57, Abstract, in the first line please add -- 14 -- between "table" and "that".

In the specification,

Column 7, line 30, please add -- 21 -- before the word "configured".

Column 7, line 35, please add -- 16 -- before the word "through".

Signed and Sealed this
Tenth Day of May, 2016

Michelle K. Lee
*Director of the United States Patent and Trademark Office*